United States Patent [19]
Lee et al.

[11] Patent Number: 5,825,693
[45] Date of Patent: Oct. 20, 1998

[54] WRITE CONTROL CIRCUIT FOR SEMICONDUCTOR MEMORY

[75] Inventors: Sang-Hyun Lee, Kyungki-Do; Kyung-Duk Kim, Seoul, both of Rep. of Korea

[73] Assignee: LG Semicon Co., Ltd., Cheongju, Rep. of Korea

[21] Appl. No.: 903,876

[22] Filed: Jul. 31, 1997

[30] Foreign Application Priority Data

Aug. 3, 1996 [KR] Rep. of Korea .................. 1996/32474

[51] Int. Cl.$^6$ ................................ G11C 7/00; G11C 8/00
[52] U.S. Cl. ................................ 365/189.05; 365/189.08; 365/203; 365/230.06; 365/233.5
[58] Field of Search ..................... 365/189.05, 189.08, 365/203, 230.06, 233.5

[56] References Cited

U.S. PATENT DOCUMENTS 5,258,951  11/1993  Yu et al. ............................. 365/189.05
5,268,863  12/1993  Bader et al. ............................. 365/203

Primary Examiner—David C. Nelms
Assistant Examiner—Trong Phan
Attorney, Agent, or Firm—Fleshner & Kim

[57] ABSTRACT

A write control circuit for a semiconductor memory that performs a high speed operations determines a write timing of data based on a control signal in cooperation with the logical combination of a write control signal and an equalization signal. The write control circuit further stably performs the write operation. The write control circuit includes a detection signal addition unit that sums output signals from address input buffer units to output a predetermined width pulse signal, an equalization signal generator that receives an output signal from the detection signal addition unit and generates an equalization signal, a write gate controller that logically combines a write control signal from a control signal input buffer and an equalization signal from the equalization signal generator to output a write gate control signal and a data driving control signal, a write data driving unit that outputs data received from a data input buffer based on a data driving control signal from the write gate controller, and a write gate unit that transmits the data output from the write data driving unit to data lines of the memory based on the write gate control signal.

18 Claims, 5 Drawing Sheets

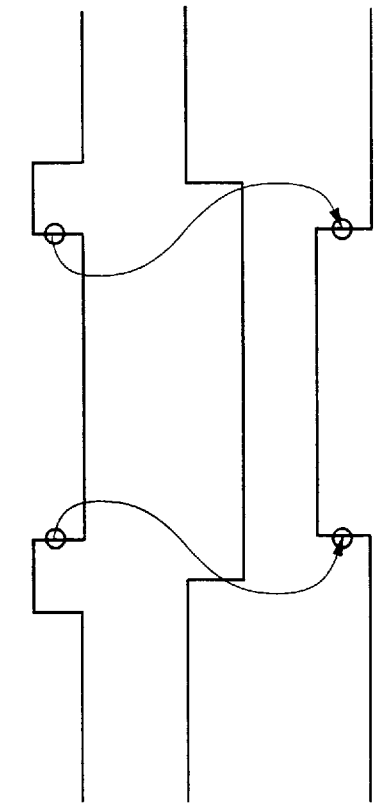
FIG.2A BACKGROUND ART — BS
FIG.2B BACKGROUND ART — $\overline{WE}$
FIG.2C BACKGROUND ART — EQWD
FIG.2D BACKGROUND ART — $\overline{WE'}$
FIG.2E BACKGROUND ART — CW
FIG.2F BACKGROUND ART — $\overline{DIN1}$, DIN1

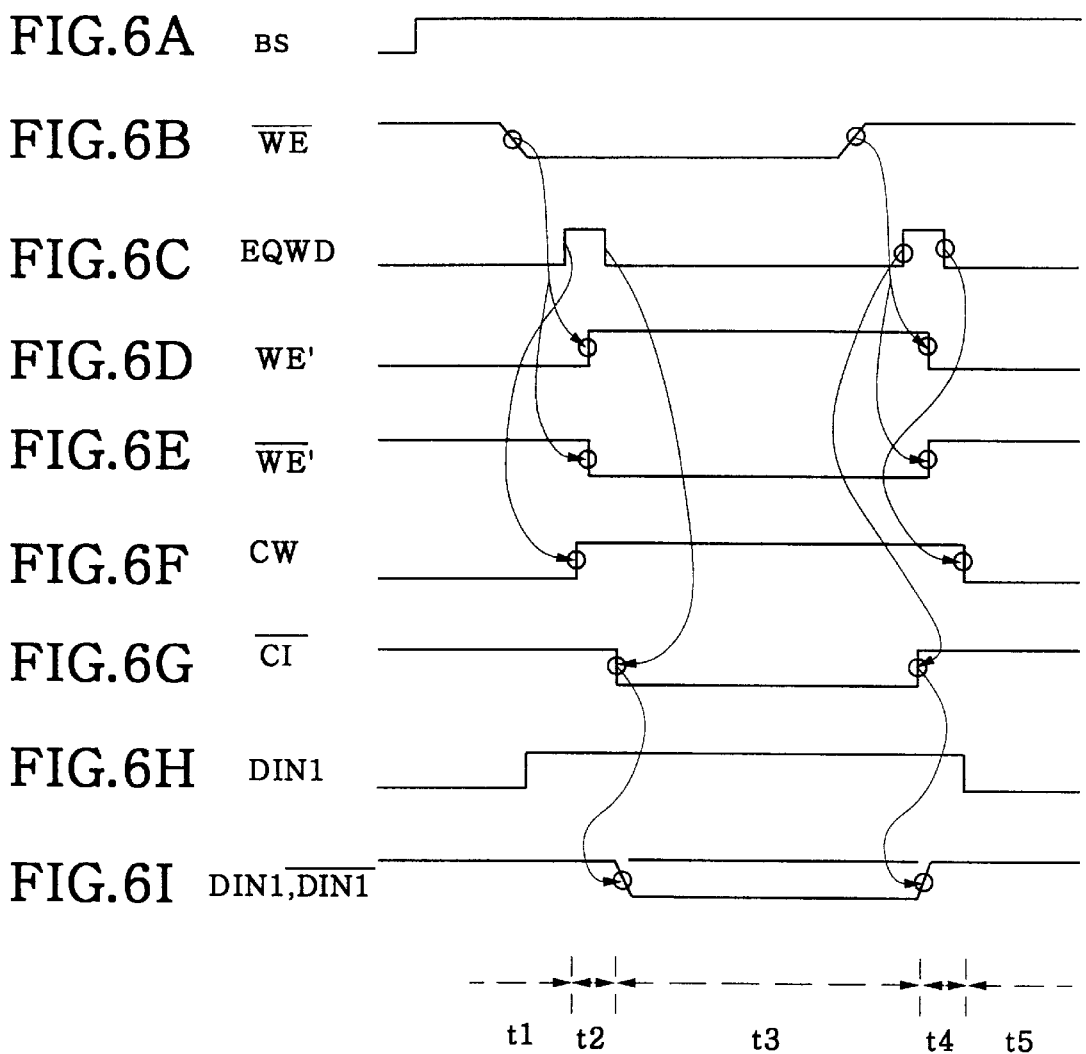
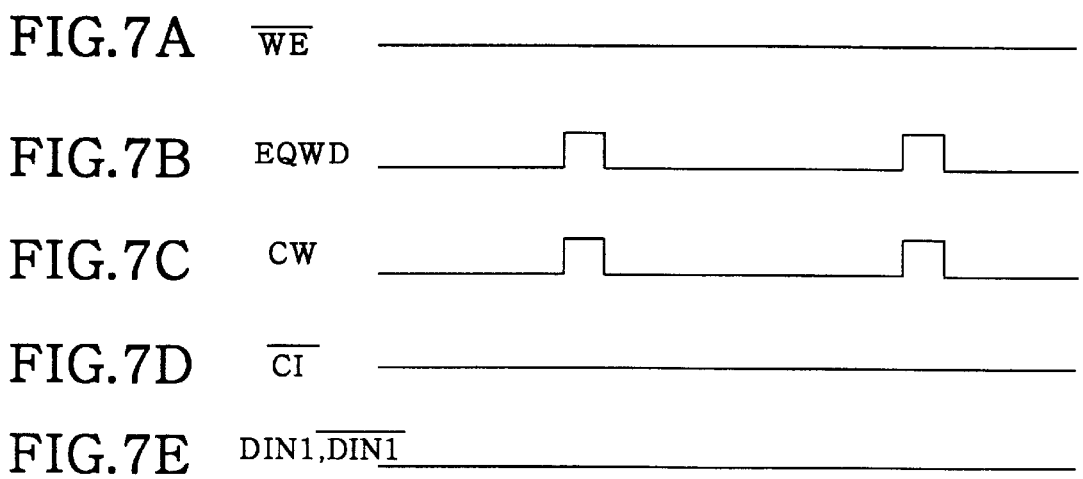

WRITE CONTROL CIRCUIT FOR SEMICONDUCTOR MEMORY

BACKGROUND OF THE INVENTION

1. Field of the Invention

The present invention relates to a write control circuit for a semiconductor memory.

2. Background of the Related Art

Generally, a Static Random Access Memory (SRAM) is directed to selecting one cell among a plurality of memory cells and performing data write and read operations using bit lines and data lines. As shown in FIG. 1, a related art semiconductor memory includes a memory cell array 108 in which a plurality of memory cells are aligned in matrix form between bit lines BL and /BL. X-address input buffers 101-1 through 101-N are connected for inputting an X-address when a chip enable signal /CE is enabled. The memory cell array 108 includes an N-number of memory cells, with each of the memory cells having transistors Q1 through Q4 and resistors R1 and R2.

An X-decoder 103 is connected for enabling a corresponding word line among word lines WL1 through WLN of the memory cell array 108 by combining output signals from the X-address input buffers 101-1 through 101-N. A Y-address input buffer 104 is connected for inputting a Y-address when the chip enable signal /CE becomes active. A Y-decoder 106 is connected for enabling a column gate 107 that performs a data input/output operation between data lines DL and /DL and the bit lines BL and /BL by receiving an output signal from the Y-address input buffer 104 as an input.

X-address transition detectors 102-1 through 102-N are connected for checking the output signal from the X-address transition detectors 101-1 through 101-N and for detecting an address transition. A Y-address transition detector 105 is connected for checking the output signal from the Y-address input buffer 104 and for detecting an address transition. A detection signal addition unit 112 is connected for adding the outputs of the X-address transition signal detectors 102-1 through 102-N and the Y-address transition signal detector 105 and for outputting a predetermined pulse signal.

An equalization signal generator 113 is connected for receiving an output signal from the detection signal addition unit 112 and for generating equalizing signals EQBL, EQDL, and EQWD. A bit line equalizer 109 is connected for logically combining a block selection signal BS and the equalizing signal EQBL from the equalization signal generator 113. A data line equalizer 110 is connected for logically combining the block selection signal BS and the equalization signal EQDL from the equalization signal generator 113.

A control signal input buffer 114 is connected for inputting a write control signal /WE when the chip enable signal /CE is enabled. A write gate controller 115 is connected for logically combining the block selection signal BS, the output signal /WE from the control signal input buffer 114, and the equalization signal EQWD from the equalization signal generator 113 to output a write gate control signal CW to a write gate 116. A data input buffer 117 is connected for inputting a data DIN when the chip enable signal /CE is enabled. A write data driving unit 118 is connected for receiving an output signal from the data input buffer 117 and for transmitting data DIN1 and /DIN1 to the data lines DL and /DL through the write gate 116. A sense amplifier 111 is connected for detecting the data of the data lines DL and /DL during a read operation and for transmitting the data to an output terminal DOUT.

Each of the X-address input buffers 101-1 through 101-N and the Y-address input buffer 104 include a NOR-gate 11 connected for inputting an address when the chip enable signal /CE is enabled to low level, and an inverter 21 for inverting the output signal from the NOR-gate 11. The column gate 107 includes transmission switches 41 and 42, which are turned on when an output signal CS from the Y-decoder 106 becomes high level, for connecting the bit lines BL and /BL to the data lines DL and /DL, respectively.

The bit line equalizer 109 includes a NAND-gate 31 and PMOS transistors Q11 through Q15. The bit lines BL and /BL are equalized when the block selection signal BS and the equalization signal EQBL are enabled to high level. The data line equalizer 110 includes a NAND-gate 32 and PMOS transistors Q5 through Q7. The data lines DL and /DL are equalized when the block selection signal BS and the equalization signal EQDL are enabled to high level.

The control signal input buffer 114 includes a NOR-gate 12 for inputting the write control signal /WE when the chip enable signal /CE is enabled to high level, and an inverter 22 for inverting an output signal from the NOR-gate 12. The data input buffer 117 includes a NOR-gate 13 for inputting the data DIN when the chip enable signal /CE is enabled to low level, and series inverters 23 and 24 for delaying the output data of the NOR-gate 13 for a predetermined time.

The write gate controller 115 includes a NOR-gate 14 and an AND-gate 51. The NOR-gate 14 inputs the output signal /WE from the control signal input buffer 114 when the equalization signal EQWD is enabled to low level. The AND-gate 51 receives the output signal from the NOR-gate 14 and outputs a write gate control signal CW when the block selection signal BS is enabled. The write gate 116 includes transmission switches 43 and 44, which are turned on when the write gate control signal CW from the write gate controller 115 is enabled, for transmitting the output data DIN1 and /DIN1 from the write data driving unit 118.

The write data driving unit 118 includes an inverter 25 for inverting an output signal /DIN' from the data input buffer 117, and an inverter 26 for inverting the output data DIN1 from the inverter 25 to output the data /DIN1.

The operation of the related art semiconductor memory will now be explained with reference to the accompanying drawings. First, when the chip enable signal /CE is enabled during a write operation, in each of the X-address input buffers 101-1 through 101-N and the Y-address input buffer 104, a corresponding address is inputted to the NOR-gates 11. The input address is outputted to the X-decoder 103 and the Y-decoder 105 through the inverters 21.

Here, the X-address transition signal detectors 102-1 through 102-N and the Y-address transition signal detector 105 detect the input/output signals from each inverter 21 of the X-address input buffers 101-1 through 101-N and the Y-address input buffer 104. When the transition detection signals are outputted to the detection signal addition unit 112, the values of the address transition detection signals are summed, and the sum is outputted to the equalization signal generator 113.

The equalization signal generator 113 receives the output signal from the transition detection signal addition unit 112, and generates the equalization signals EQBL, EQDL, and EQWD. The X-decoder 103 combines the output signals from the X-address input buffers 101-1 through 101-N, and enables a corresponding word line among the word lines WL1 through WLN of the memory cell array 108.

As shown in FIG. 2A, the block selection signal BS is enabled in accordance with the address. As shown in FIG. 2B, when the write signal /WE is enabled to low level, the NOR-gate 12 of the control signal input buffer 114 NORs the write signal /WE and the chip enable signal /CE. Then, the corresponding inverter 22 inverts the NORed signal from the NOR-gate 12 to low level, and the write control signal /WE' as shown in FIG. 2D is outputted to the write gate controller 115.

The NOR-gate 14 of the write gate controller 115 NORs the equalization signal EQWD (as shown in FIG. 2C) from the equalization signal generator 113 and the output signal /WE' (as shown in FIG. 2D) from the control signal input buffer 114. The AND-gate 51 ANDs the NORed signal and the block selection signal BS shown in FIG. 2A, and outputs the write gate control signal CW of a high level as shown in FIG. 2E to the write gate 116 while the signal EQWD is low.

The bit line equalizer 109 equalizes the bit lines BL and /BL to the same high level by turning on the PMOS transistors Q13 through Q15 in accordance with the low level output signal from the NAND-gate 31 when the equalization signal EQBL from the equalization signal generator 113 becomes high level. The data line equalizer 110 equalizes the data lines DL and /DL to the same high level by turning on the PMOS transistors Q5 through Q7 in accordance with the low level output signal from the NAND-gate 32 when the equalization signal EQDL from the equalization signal generator 113 becomes high level.

The NOR-gate 13 of the data input buffer 117 NORs the input data DIN and the chip enable signal /CE, and outputs a data /DIN' through the inverters 23 and 24. The inverters 25 and 26 of the write data driving unit 118 invert the data /DIN', and output the data DIN1 and /DN1 as shown in FIG. 2F to the write gate 116. The data DIN1 and /DIN1 are signals which are delayed by the inverters 23 through 26 for the predetermined time.

When the write gate control signal CW from the write gate controller 115 is enabled to high level as shown in FIG. 2E, the transmission switches 43 and 44 of the write gate 116, which switches are connected to the data lines DL and /DL, are turned on. When the transmission switches 43 and 44 are turned on, the output data DIN1 and /DIN1 is transmitted from the write data driving unit 118 to the data lines DL and /DL, respectively.

The Y-decoder 106 receives the output signal from the Y address input buffer 104, and outputs a high level column selection signal CS. The transmission switches 41 and 42 of the column gate 107 are turned on, and the data DIN1 and /DIN1 carried on the data lines DL and /DL are transmitted to a corresponding memory cell. The corresponding memory cell among the memory cells of the memory cell array 108 is selected by the word line in accordance with the combination of the X row address and the column gate 107, so that a write operation is performed.

As shown in FIG. 2B, the write operation is completed when the write signal /WE is disabled to high level, the equalization signal EQWD from the equalization signal generator 113 becomes high level as shown in FIG. 2C, and the output signal from the write gate controller 115 is disabled to low level.

However, the related art write control circuit has various disadvantages. In the related art write control circuit for a semiconductor memory, since the generation of a write control signal for performing the write operation and a desired data input adjusting operation are independently performed, a timing mismatch between the above-described signals must be accommodated, which requires a lengthy time to satisfy a write parameter. Accordingly, a high speed operation is impossible.

In addition, in the related art write control circuit for a semiconductor memory, because the electric potential of the bit line must be increased by only a precharging with respect to the bit line and the data line and the equalization circuit after the write operation, a write recovery process requires increased time, so it becomes impossible to secure sufficient time for the write operation.

The above references are incorporated by reference herein where appropriate for appropriate teachings of additional or alternative details, features and/or technical background.

SUMMARY OF THE INVENTION

An object of the present invention to provide a write control circuit for a semiconductor memory that overcomes at least the above-described limitations and disadvantages of the related art write control circuit for a semiconductor memory.

Another object of the present invention is to provide a write control circuit for a semiconductor memory that performs high speed operations.

A further object of the present invention is to provide a write control circuit for a semiconductor memory that determines a write timing of a data based on a control signal in cooperation with a logical combination with respect to a write control signal and an equalization signal.

A further object of the present invention is to provide a write control circuit for semiconductor memory that performs a more stable write operation.

A further object of the present invention to provide a write control circuit for a semiconductor memory that recovers the voltage of a data line after data is written into a memory cell.

A further object of the present invention to provide a write control circuit for a semiconductor memory that performs a precharging function with a circuit arranged for a write data enabling during a read operation of a memory cell.

A further object of the present invention to provide a write control circuit for a semiconductor memory that improves a write gate control and write data driving for a semiconductor memory that selects a corresponding memory cell among the memory cell arrays and reads/writes a data through a bit line and a data line in cooperation with the addresses.

To achieve at least the above objects in whole or in part, there is provided a write control circuit for a semiconductor memory that includes a detection signal addition unit for adding output signals from an address input buffer unit and for outputting a predetermined width pulse signal, an equalization signal generator for receiving an output signal from the detection signal addition unit as an input value and for generating an equalization signal, a write gate controller for logically combining a write control signal from a control signal input buffer unit and an equalization signal from the equalization signal generator and for outputting a write gate control signal and a data driving control signal, a write data driving unit for receiving an output data from a data input buffer in accordance with a data driving control signal from the write gate controller and for outputting data, and a write gate unit for transmitting output data from the write data driving unit to data lines of a memory cell in accordance with the write gate control signal from the write gate controller.

The present invention can be achieved in parts or in a whole by a write control circuit that reads and writes data in a selected memory cell among memory cell arrays via data lines and bit lines based on a combination of addresses, the write control circuit comprising a write gate controller that logically combines a write control signal and an equalization signal and outputs a write gate control signal and a data driving control signal and a write data driving circuit that receives input data and outputs the data based on the data driving control signal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 2A–2F are diagrams illustrating timing of the circuit of FIG. 1;

FIGS. 6A–6I are diagrams illustrating timing of a write operation of the circuit of FIG. 3; and FIGS. 7A–7E are waveform diagrams illustrating signals of each element of the circuit of FIG. 3 during a read operation.

DETAILED DESCRIPTION OF PREFERRED EMBODIMENTS

Figure 1:
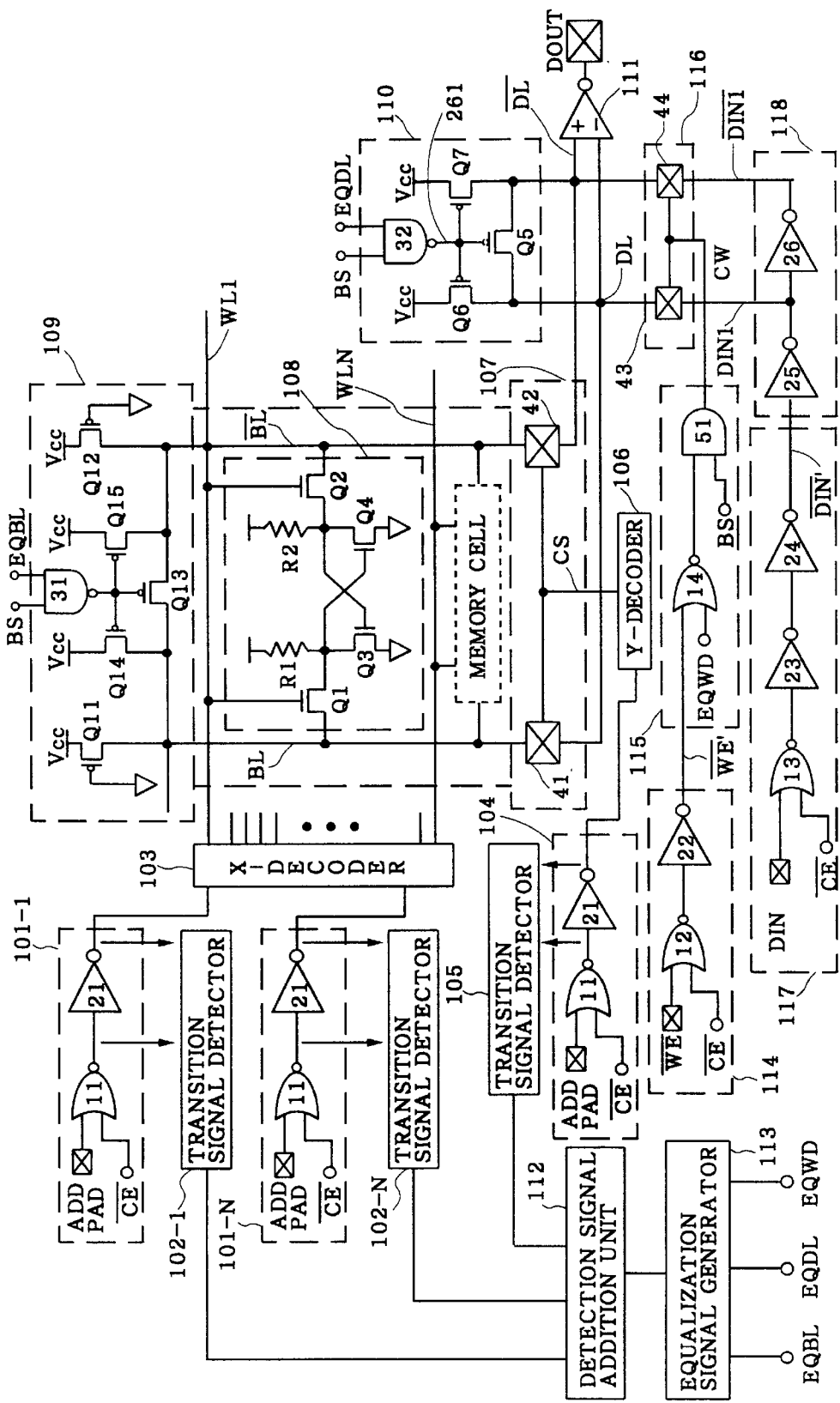
FIG. 1 is a circuit diagram illustrating a related art semiconductor memory.
Figure 3:
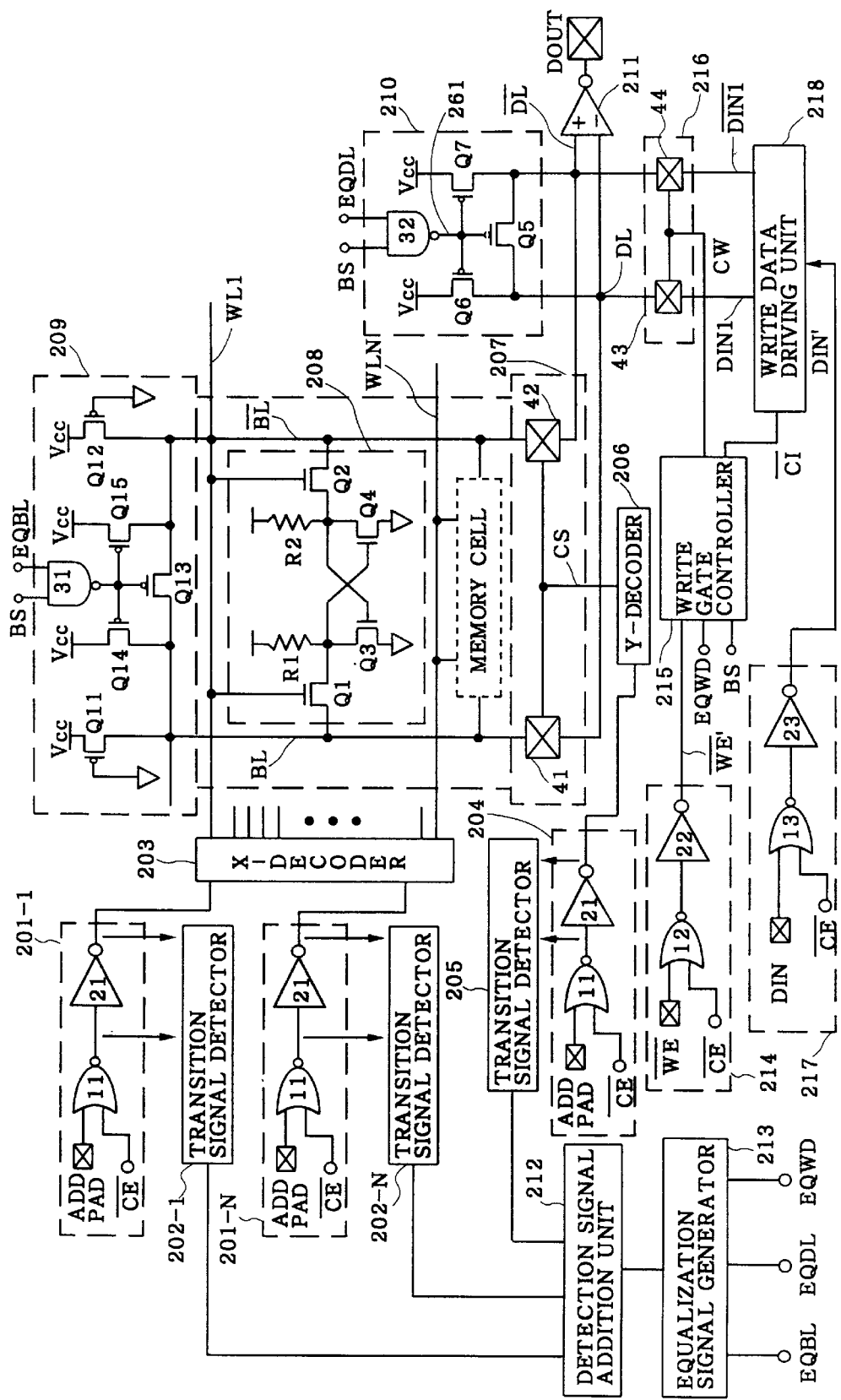
FIG. 3 is a circuit diagram illustrating a preferred embodiment of a write control circuit for a semiconductor memory according to the present invention.

A preferred embodiment of a write control circuit for a semiconductor memory according to the present invention will now be described. As shown in FIG. 3, a memory cell array 208, in which a plurality of memory cells are arranged in a matrix form between bit lines BL and /BL, is coupled for storing data. X-address input buffers 201-1 through 201-N are coupled for inputting X-addresses Xaddr1 through Xaddrn when a chip enable signal /CE is activated. The constructions of the X-address input buffers 201-1 through 201-N and the Y-address input buffer 204 are similar to the related art circuit shown in FIG. 1. Accordingly, a detailed description is omitted.

An X-decoder 203 is coupled for combining output signals from the X-address input buffers 201-1 through 201-N and for enabling a corresponding word line among word lines WL1 through WLN of the memory cell array 208. A Y-address input buffer 204 is coupled for inputting a Y-address Yaddr when the chip enable signal /CE is activated. A Y-decoder 206 is coupled for enabling a column gate 207 that performs a data input/output operation between data lines DL and /DL and the bit lines BL and /BL of the memory cell array 208 in accordance with an output signal from the Y-address input buffer 204.

X-address transition signal detectors 202-1 through 202-N are coupled for checking the output signals from the X-address input buffers 201-1 through 201-N and for detecting the transition of an address. A Y-address transition signal detector 205 is coupled for checking the output signal from the Y-address input buffer 204 and for detecting an address transition. A detection signal addition unit 212 is coupled for preferably adding the outputs of the X-address transition detectors 202-1 through 202-N and Y-address transition detector 205, and for outputting a predetermined pulse signal.

An equalization signal generator 213 is coupled for receiving an output signal from the transition detection signal addition unit 212 and for generating equalization signals EQBL, EQDL, and EQWD. A bit line equalizer 209 is coupled for logically combining a block election signal BS and the equalization signal EQBL and for equalizing the bit lines BL and /BL of the memory cell array 208. A data line equalizer 210 is coupled for logically combining the block selection signal BS and the equalization signal EQDL and for equalizing the data lines DL and /DL.

A control signal input buffer 214 is coupled for inputting a write signal /WE when the chip enable signal /CE is activated. A write gate controller 215 is coupled for logically combining the block selection signal BS, a write signal /WE' output from the control signal input buffer 214, and the equalization signal EQWD and for outputting a write gate control signal CW and a data driving control signal /CI. A data input buffer 217 is coupled for inputting a data DIN when the chip enable signal /CE is enabled.

A write data driving unit 218 is coupled for transmitting data DIN' output from the data input buffer 217 based on the data driving control signal /CI from the write gate controller 215. A write gate 216 is coupled for transmitting the data output DIN1 and /DIN1 from the write data driving unit 218 to the data lines DL and /DL when the write gate control signal CW from the write gate controller 215 is enabled to high level. A sense amplifier 211 is coupled for detecting the data of the data lines DL and /DL during a read operation and for transmitting the data to an output terminal DOUT.

The data input buffer 217 includes a NOR-gate 13 for NORing the chip enable signal /CE and the input data DIN, and an inverter 23 for inverting an output signal from the NOR-gate 13 to output the inverted data DIN' to the write data driving unit 218.

The data line equalizer 210 includes a NAND-gate 32 for NANDing the block selection signal BS and the equalization signal EQDL from the equalization signal generator 213. The data line equalizer 213 further includes PMOS transistors Q5–Q7 for equalizing the data lines DL and /DL in accordance with an output signal from the NAND-gate 32.

Figure 4:
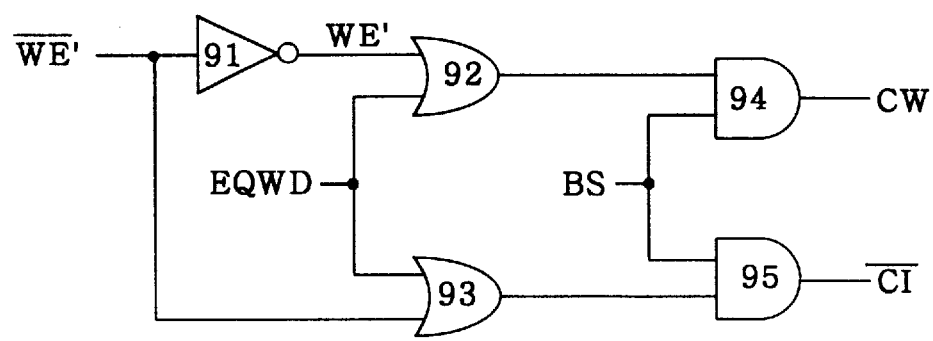
FIG. 4 is a circuit diagram illustrating a write gate controller of FIG. 3.

The write gate controller 215, as shown in FIG. 4, includes an inverter 91, OR-gates 92, 93 and AND-gates 94–95. The inverter 91 is coupled for inverting the output signal /WE' from the control signal input buffer 214. The OR-gate 92 is coupled for logically ORing an output signal WE' from the inverter 91 and the equalization signal EQWD. The OR-gate 93 is coupled for logically ORing the output signal /WE' from the control signal input buffer 214 and the equalization signal EQWD. The AND-gate 94 is coupled for logically ANDing the block selection signal BS and an output signal from the OR-gate 92 to output the write gate control signal CW. The AND-gate 95 is coupled for logically ANDing the block selection signal BS and an output signal from the OR-gate 93 to output the data driving control signal /CI.

Figure 5:
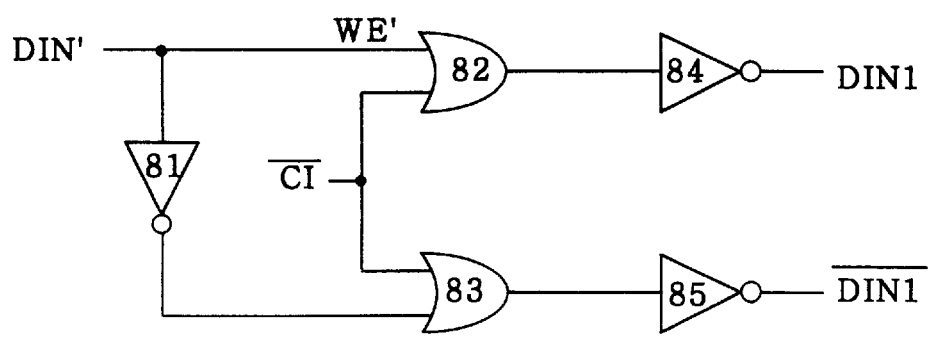
FIG. 5 is a circuit diagram illustrating a write data driving unit of FIG. 3.

As shown in FIG. 5, the write data driving unit 218 includes NOR-gates 82, 83 and inverters 81, 84, 85. The NOR-gate 82 is coupled for NORing the data driving control signal /CI from the write gate controller 215 and the output data DIN' from the data input buffer 217. The inverter 84 is coupled for inverting the output signal from the NOR-gate 82 to output the data DIN1 to the write gate 216. The inverter 81 is coupled for inverting the output data DIN' from the data input buffer 217. The NOR-gate 83 is coupled for NORing an output signal from the inverter 81 and the data driving control signal /CI from the write gate controller 215. The inverter 85 is coupled for inverting an output signal from the NOR-gate 83 to output the data /DIN1 to the write gate 216.

Operations of the preferred embodiment of the write control circuit for the semiconductor memory will now be described. First, when the chip enable signal /CE is enabled from a high level to a low level during a write operation, in each of the X-address input buffers 201-1 through 201-N and the Y-address input buffer 204, the NOR-gate 11 inputs a corresponding address bit. The inputted address bits are outputted to the X-decoder 203 and the Y-decoder 206 through the inverters 21.

The block selection signal BS is enabled to high level as shown in FIG. 6A with the application of the X-address to the address input buffers 201-1 through 201-N and the Y-address input buffer 204. If the write signal /WE shown in FIG. 6C is disabled to high level, the output signal WE' from the NOR-gate 12 of the control signal input buffer 214 becomes low level as shown in FIG. 6D. Further, the output signal /WE' from the inverter 22 becomes high level as shown in FIG. 6E.

Thus, the output signal from the OR-gate 92 of the write gate controller 215 is low level, and the AND-gate 94 outputs a low level write gate control signal CW as shown in FIG. 6F. Then, the output signal from the OR-gate 93 becomes high level, and the AND-gate 95 outputs a high level data driving control signal /CI as shown in FIG. 6G. At the moment when the write signal /WE is enabled to low level, (when the data DIN is inputted), the NOR-gate 13 of the data input buffer 217 outputs a low level signal, and the output signal DIN' from the inverter 23 becomes high level as shown in FIG. 6H.

Since the data driving control signal /CI from the write gate controller 215 is high level, the output signals from the NOR-gates 82 and 83 of the write data driving unit 218 become low level and high level, respectively. Further, the output signals DIN1 and /DIN1 from the inverters 84 and 85 become high level and low level, respectively.

The X-address transition signal detectors 202-1 through 202-N and the Y-address transition signal detector 205 check the input/output signal from the corresponding inverter 21 of each of the X-address input buffers 201-1 through 201-N and the Y-address input buffer 204 to output a transition detection signal to the transition detection signal addition unit 212. The transition detection signals are added by the transition detection signal addition unit 212 and are outputted to the equalization signal generator 213.

The equalization signal generator 213 receives the output signal from the transition detection signal addition unit 212 and generates equalization signals EQBL, EQDL, and EQWD. The equalization signal EQWD is enabled with the timing shown in FIG. 6C. The equalization signals EQBL and EQDL are enabled at the same moment as the equalization signal EQWD. However, the pulse widths are respectively different between the equalization signal EQWD and the equalization signals EQBL and EQDL.

When the output signals EQBL and EQDL from the equalization signal generator 213 are enabled to high level, the output signal from the NAND-gate 31 of the bit line equalizer 209 becomes low level. Accordingly, and the PMOS transistors Q13 through Q15 are turned on, and the bit lines BL and /BL are equalized. Further, the output signal from the NAND-gate 32 of the data line equalizer 210 becomes low level. Accordingly, the PMOS transistors Q5 through Q7 are turned on, and the data lines DL and /DL are equalized.

The output of OR-gate 92 of the write gate controller 215 receiving the high level equalization signal EQWD from the equalization signal generator 213 becomes high level, and the write gate control signal CW outputted from the AND-gate 94 becomes high level. The output signal from the OR-gate 93 maintains a high level, which maintains the data driving control signal /CI outputted from the AND-gate 95 high level. Thus, the transmission switches 43 and 44 of the write gate 216 are turned on, and the write data driving unit 218 outputs high and low level output signals DIN1 and /DIN1 to the data lines DL and /DL, respectively.

The data lines DL and /DL are equalized by the bit line equalizer 209 at an initial stage; however, at a later stage, the data lines DL and /DL are equalized by the high and low level signals DIN1 and /DIN1 from the write data driving unit 218. The high and low level signals DIN1 and /DIN1 are transmitted to the data lines DL and /DL through the write gate 216.

The control signal input buffer 214 outputs a low level write control signal /WE' as shown in FIG. 6E by logically combining the write signal /WE, which is enabled to low level, and the active low level chip enable signal /CE through the NOR-gate 12 and the inverter 22. Since the write signal WE' output from the inverter 91 of the write gate controller 215 is high level, the output signal from the OR-gate 92 maintains a high level. Further, the write gate control signal CW from the AND-gate 94 becomes a high level. Since the output signal from the OR-gate 93 is high level, the data driving control signal /CI from the AND-gate 95 maintains a high level.

When the equalization signal EQWD from the equalization signal generator 213 becomes low level, the output signal from the OR-gate 93 of the write gate controller 215 becomes low level, and the data driving control signal /CI from the AND-gate 95 becomes low level as shown in FIG. 6G. In addition, since the output signal from the inverter 91 is high level, the output signal from the OR-gate 92 remains high level. The AND-gate 94 maintains a high level write gate control signal CW as shown in FIG. 6F.

The output signal from the NOR-gate 82 of the write data driving unit 218 maintains a low level in accordance with the high level input signal DIN', and a high level data DIN1 is outputted through the inverter 84. Since the output signal from the inverter 81 is low level, the output signal from the NOR-gate 82, both input terminals of which are applied with a low level signal, becomes high level, and the low level data /DIN1 is outputted through the inverter 85. Accordingly, the output data DIN1 and /DIN1 from the write data driving unit 218 are transmitted through the write gate 216, and are respectively carried on the data lines DL and /DL.

The X-decoder 203 combines the output signals from the X-address input buffers 201-1 through 201-N, and enables a corresponding word line among the word lines WL1 through WLN of the memory cell array 108. The Y-decoder 206 enables the column selection signal CS based on the output signal from the Y-address input buffer 204. Accordingly, the transmission switches 41 and 42 of the column gate 207 are turned on. The data carried on the data lines DL and /DL are transmitted to the bit lines BL and /BL and stored in the cell selected by the word line selected from the memory cell array 208. The word line selected by the X-decoder 203 is then disabled, and the Y-decoder 206 turns off the transmission switches 41 and 42 of the column gate 207.

When the write signal /WE is disabled to high level and the equalization signal EQWD from the equalization signal generator 213 is again enabled to high level after a predetermined time, the output signal from the OR-gate 93 of the write gate controller 215 becomes high level, and the data driving control signal /CI outputted from the AND-gate 95 is transited to high level. Since the output signal from the OR-gate 93 maintains a high level, the write gate control signal CW outputted from the AND-gate 94 continuously maintains a high level.

The output signals from the NOR-gates 82 and 83 of the write data driving unit 218 that receive the high level output signal /CI from the write gate controller 215 become low level. In addition, the data DIN1 and /DIN1 outputted from the inverters 84 and 85 are high level. The output data DIN1 and /DIN1 from the write data driving unit 218 are transmitted to the data lines DL and /DL through the write gate 216 and are equalized.

The control signal input buffer 214 logically combines the write signal /WE, which is transited to low level, and the chip enable signal /CE, which is inputted thereto through the NOR-gate 12 and the inverter 22, and disables the write control signal /WE' to a high level as shown in FIG. 6E.

Since the output signal from the OR-gate 93 of the write gate controller 215 maintains a high level, the data driving control signal /CI from the AND-gate 95 maintains a high level. The output signal from the inverter 91 maintains a low level. However, since the equalization signal EQWD from the equalization signal generator 213 is high level, the output signal from the OR-gate 92 becomes high level, and the write gate control signal CW from the AND-gate 94 becomes high level.

When the equalization signal EQWD from the equalization signal generator 213 is disabled to low level, the output signal from the OR-gate 92 of the write gate controller 215 becomes low level. Thus, the write gate control signal CW from the AND-gate 94 becomes low level as shown in FIG. 6F. Accordingly, the transmission switches 43 and 44 of the write gate 216 are turned off, and the coupling between the output terminals DIN1 and /DIN1 of the write data driving unit 218 and the data lines DL and /DL is decoupled. Then, the write operation is finished.

The write gate controller 215 enables the write gate control signal CW at the enabling time of the equalization signals from the equalization signal generator 213. The equalization signals are generated at the moment when the write operation starts. Further, the write gate controller 215 disables the write gate control signal CW at the disabling time of the equalization signal EQWD generated at the moment when the write operation is finished. Thus, the write gate control signal CW has the wave form as shown in FIG. 6F. In addition, the write gate controller 215 enables the data driving control signal /CI at the disabling time of the equalization signal EQWD generated at the moment when the write operation starts. In addition, the write gate controller 215 disables the data driving control signal /CI at the enabling time of the equalization signal EQWD generated at the time when the write operation is finished. Thus, the data drive control signal /CI has the waveform shown in FIG. 6G.

Therefore, the operation of the write gate 216 is controlled based on the write gate control signal CW, and the level of the output signals DIN1, /DIN1 is determined from the write data driving unit 218.

The write operation of the write control circuit for a semiconductor memory according to the present invention is performed based on the five intervals described below and shown in FIGS. 6A–6I.

First, in an interval (i.e., t1, t5), the write gate control signal CW and the data driving control signal /CI are both disabled. This interval is not directly related to the write operation.

Second, in an interval (i.e., t2, t4), the write gate control signal CW is enabled, and the data driving control signal /CI is disabled. In addition, the transmission switches 43 and 44 of the write gate 216 are turned on. The write data driving unit 218 precharges and equalizes the data lines DL and /DL in accordance with high level output signals DIN1 and /DIN1.

Third, in an interval (i.e., t3), the write gate control signal CW and the data driving control signal /CI are both enabled. The write data driving unit 218 performs the write operation of writing a data into a cell selected among the memory cell arrays 208 through the data lines DL and /DL and the bit lines BL and /BL.

The preferred embodiment of the write control circuit for a semiconductor memory is directed to precharging and equalizing the data lines DL and /DL and the bit lines BL and /BL at the same duration as the duration of the addition with respect to the address transition detection signal before and after the write operation.

To perform a corresponding read operation, the address transition detectors 202-1 through 202-N, the X-decoder 203, the Y-decoder 206, the transition detection signal addition unit 212, and the equalization signal generator 213 perform similar operations as during the write operation. Further, the block selection signal BS is enabled to high level, and the chip enable signal /CE is enabled to low level.

The write signal /WE maintains an inactive high level as shown in FIG. 7A. The output signal from the NOR-gate 12 of the control signal input buffer 214 becomes low level, and the high level write control signal /WE' is outputted to the write gate controller 215 through the inverter 22.

Since the output signal from the OR-gate 93 of the write gate controller 215 is continuously high level, the data driving control signal /CI from the AND-gate 95 maintains high level as shown in FIG. 7D. In addition, only when the equalization signal EQWD output from the equalization signal generator 213 is enabled to high level as shown in FIG. 7B, the output signal from the OR-gate 92 becomes high level. In this case, the write gate control signal CW from the AND-gate 94 is enabled to high level as shown in FIG. 7C.

The write data driving unit 218 receives the high level output signal /CI from the write gate controller 215. The output signals from the NOR-gates 82 and 83 both become low level, and the high level data DIN1 and /DIN1 are respectively outputted through the inverters 84 and 85.

Therefore, when the output signal CW from the write gate controller 215 is enabled to high level, the transmission switches 43 and 44 of the write gate 216 are turned on. The high level data signals DIN1 and /DIN1 from the write data driving unit 218 are transmitted to the data lines DL and /DL, which equalizes the data lines DL and /DL.

When the equalization signal EQWD from the equalization signal generator 213 is disabled to low level, the output signal from the OR-gate 92 of the write gate controller 215 becomes low level, and the write gate control signal CW from the AND-gate 94 is disabled to low level.

When a corresponding word line is selected among the word lines WL1 through WLN of the memory cell array 208, the transistors Q1 and Q2 of the corresponding memory cell are turned on, and the data stored in the transistors Q3 and Q4 are carried on the bit lines BL and /BL.

When the transmission switches 41 and 42 of the column gate 207 are turned on by the Y-decoder 206, the data carried on the bit lines BL and /BL are transmitted to the data lines DL and /DL. The sense amplifier 211 detects the data carried on the data lines DL and DL and outputs the data to the external output terminal DOUT. Thereafter, the read operation is finished.

The level of the write gate control signal CW is determined based on the level transition of the equalization signal based on EQWD, and the data driving control signal /CI is disabled. Therefore, the output signals DIN1 and /DIN1 from the write data driving unit 218 both become high level based on the disabled data driving control signal /CI.

Since the write gate control signal CW enables the write gate 216 at the same phase as the equalization signal EQWD, it is possible to obtain a desired precharging and equalization effect with respect to the data lines DL and /DL and the bit lines BL and /BL by the write data driving unit 218 during the read operation. The above-described read operation is shown in FIGS. 7A–7E.

As described above, since the preferred embodiment of the write control circuit for a semiconductor memory according to the present invention is directed to synchronizing the write control signal to the address transition detection signal, accurate operation timing is provided between the control signals to achieve a high speed operation.

In particular, since the preferred embodiment of the write control circuit is directed to precharging and equalizing the data lines and bit lines using the write data driving circuit after the write operation, an increased write time is provided.

In addition, the loading operation of the equalization circuit of the data lines and the bit lines is reduced by precharging and equalizing the data lines and the bit lines using the write data driving circuit, even during the read operation.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A write control circuit that reads and writes data in a selected memory cell among memory cell arrays via data lines and bit lines based on a combination of addresses, the write control circuit comprising:

detection signal addition means for adding output signals from address input buffer means and for outputting a pulse signal;

equalization signal generator means for generating an equalization signal based on the pulse signal;

write gate control means for logically combining a write control signal from a control signal input buffer and the equalization signal and for outputting a write gate control signal and a data driving control signal;

write data driving means for receiving data from a data input buffer based on the data driving control signal and for outputting the data; and write gate means for transmitting the data output from the write data driving means to the data lines based on the write gate control signal.

2. The circuit of claim 1, wherein said write gate control means enables the write gate control signal when the equalization signal is enabled after the write control signal is enabled during a write operation and disables the write gate control signal when the equalization signal is disabled after the write control signal is disabled, and wherein the data driving control signal is enabled when the equalization signal is disabled after the write control signal is enabled and the data driving control signal is disabled when the equalization signal is enabled after the write control signal is disabled.

3. The circuit of claim 2, wherein said write gate control means includes:

a first logic-gate for logically processing the write control signal;

a second logic-gate for logically processing an output signal from the first logic-gate and the equalization signal;

a third logic-gate for logically processing the write control signal and the equalization signal; and fourth and fifth logic-gates for logically processing a block selection signal with output signals from the second and third logic-gates, respectively, and for outputting the write gate control signal and the data driving control signal, respectively.

4. The circuit of claim 3, wherein the first logic-gate is an inverter, the second and third logic-gates are OR-gates and the fourth and fifth logic-gates are AND-gates.

5. The circuit of claim 1, wherein said write gate control means maintains a high level data driving control signal during a read operation, and wherein a status of the write gate control signal is concurrently enabled with the equalization signal.

6. The circuit of claim 5, wherein said write gate control means includes:

a first logic-gate for logically processing the write control signal;

a second logic-gate for logically processing an output signal from the first logic-gate and the equalization signal;

a third logic-gate for logically processing the write control signal and the equalization signal; and fourth and fifth logic-gates for logically processing a block selection signal with output signals from the second and third logic-gates, respectively, and for outputting the write gate control signal and the data driving control signal, respectively.

7. The circuit of claim 6, wherein the first logic-gate is an inverter, the second and third logic-gates are OR-gates and the fourth and fifth logic-gates are AND-gates.

8. The circuit of claim 1, wherein said write data driving means outputs a high level output data while the data driving control signal is disabled.

9. The circuit of claim 8, wherein said write data driving means includes:

a first logic-gate for logically processing an output signal from the data input buffer means and the data driving control signal;

a second logic-gate for logically processing an output signal from the first logic-gate and for outputting a first data;

a third logic-gate for logically processing an output signal from the data input buffer means;

a fourth logic-gate for logically processing an output signal from the third logic-gate and the data driving control signal; and a fifth logic gate for logically processing an output signal from the fourth logic-gate and for outputting a second data.

10. The circuit of claim 9, wherein the second, third and fifth logic gates are inverters and the first and fourth logic gates are NOR-gates.

11. A write control circuit that reads and writes data in a selected memory cell among memory cell arrays via data lines and bit lines based on a combination of addresses, the write control circuit comprising:

a write gate controller that logically combines a write control signal and an equalization signal and outputs a write gate control signal and a data driving control signal; and a write data driving circuit that receives input data and outputs the data based on the data driving control signal.

12. The write control circuit of claim 11, the input dat are logically processed by an input data function prior to receipt by the write data driving circuit.

13. The write control circuit of claim 11, further comprising:

a detection signal addition circuit that sums output signals from an address input buffer circuit and outputs a pulse signal;

an equalization signal generator circuit that generates an equalization signal based on the pulse signal; and a write gate that transmits the data output from the write data driving circuit to the data lines based on the write gate control signal.

14. The write control circuit of claim 11, wherein a control signal input buffer outputs the write control signal and a data input buffer inputs the input data.

15. The write control circuit of claim 11, wherein the data lines are precharged based on the equalization signal and the write gate control signal.

16. The write control circuit of claim 11, wherein a write gate controller interlinks a input data preprocessing function with write gate control using the write gate control signal and the data driving control signal.

17. The write control circuit of claim 11, wherein said write gate controller comprises:

a first logic-gate for logically processing the write control signal;

a second logic-gate for logically processing an output signal from the first logic-gate and the equalization signal;

a third logic-gate for logically processing the write control signal and the equalization signal; and fourth and fifth logic-gates for logically processing a block selection signal with output signals from the second and third logic-gates, respectively, and for outputting the write gate control signal and the data driving control signal, respectively.

18. The circuit of claim 17, wherein the first logic-gate is an inverter, the second and third logic-gates are OR-gates and the fourth and fifth logic-gates are AND-gates.

* * * * *